(12) United States Patent
Lee (10) Patent No.: US 6,531,360 B2
(45) Date of Patent: Mar. 11, 2003

(54) METHOD OF MANUFACTURING A FLASH MEMORY DEVICE

(75) Inventor: Woon-Kyung Lee, Kyunggi-do (KR)

(73) Assignee: Samsung Electronics Co. Ltd., Kyungki-do (KR)

(*) Notice: Subject to any disclaimer, the term of this patent is extended or adjusted under 35 U.S.C. 154(b) by 40 days.

(21) Appl. No.: 09/948,424

(22) Filed: Sep. 7, 2001

(65) Prior Publication Data
US 2002/0045303 A1 Apr. 18, 2002

(30) Foreign Application Priority Data
Oct. 12, 2000 (KR) ........................................ 2000-60033

(51) Int. Cl.⁷ ............................................. H01L 21/336
(52) U.S. Cl. ........................ 438/257; 438/264; 438/266
(58) Field of Search .................................. 438/257, 264, 438/266

(56) References Cited

U.S. PATENT DOCUMENTS 5,766,996 A * 6/1998 Hayakawa et al. ......... 438/257
6,372,577 B1 * 4/2002 Fang ........................... 438/258
6,376,879 B2 * 4/2002 Mori et al. .................. 257/347
2001/0045590 A1 * 11/2001 Kobayashi ................... 257/298

\* cited by examiner

Primary Examiner—Trung Dang
(74) Attorney, Agent, or Firm—Marger Johnson & McCollom P.C.

(57) ABSTRACT

A method of manufacturing a flash memory device is characterized by preventing photoresist patterns from being formed directly on or removed directly from a surface of the substrate or the dielectric layer. This is accomplished by separately forming a control gate layer of transistors in a cell area of the substrate and a gate layer of transistors in a peripheral circuit area of the substrate. The method of the present invention includes the steps of forming in a peripheral circuit area of the substrate a gate insulating layer for both high and low voltage regions of the peripheral circuit area and then forming the gate conduction layer on the gate insulating layer. The method of the present invention further comprises the steps of forming in a cell area of the substrate a transistor structure composed of a tunneling gate insulating layer, a floating gate layer, a dielectric layer, and a control gate layer.

22 Claims, 13 Drawing Sheets

METHOD OF MANUFACTURING A FLASH MEMORY DEVICE

This application relies for priority upon Korean Patent Application No. 2000-60033, filed on Oct. 12, 2000, the contents of which are herein incorporated by reference in their entirety.

BACKGROUND OF THE INVENTION

In a flash memory device, increased integration, improved operating efficiency or performance, and insurance of mass productivity are very important goals that should be continuously improved and developed. However, because of the complex elements incorporated into the flash memory device, it is not easy to simultaneously achieve these goals.

The complexity of the integrated elements results from the operating characteristics of the flash memory device. Namely, the flash memory device, a nonvolatile memory type, is designed to have three operating modes—programming, erasing, and reading data. In order to carry out these three modes, the flash memory device needs to form high and low voltage transistors in a peripheral circuit area thereof along with transistors having double gates in a cell area thereof. The gate insulating layer and source/drain regions in the high voltage transistor can be formed to have respectively different thickness and structure compared with those in the low voltage transistor. Also, the peripheral circuit area of the flash memory device generally has a complementary metal oxide silicon (CMOS) structure which, like that of other memory devices, simultaneously uses p-channel and n-channel transistors to increase efficiency or performance.

As element complexity increases, the processes required to manufacture a flash memory device also become more complicated and difficult. Among the characteristics of the flash memory device, the endurance characteristic showing whether or not thermal damage has occurred with repeated programming and erasing and the data retention characteristic showing how long it continues to store data after programming are both important. The endurance and data retention characteristics are dependent on the quality of a dielectric layer and a gate insulating layer which are in contact with floating gates in a cell area of the flash memory device. Also, the characteristics of high and low voltage transistors in a peripheral circuit area, which has a large influence on functional operation of the flash memory device, is dependent on the quality of the gate insulating layer. However, it is not easy to form both a superior gate insulating layer and quality dielectric layer.

Figure 1:
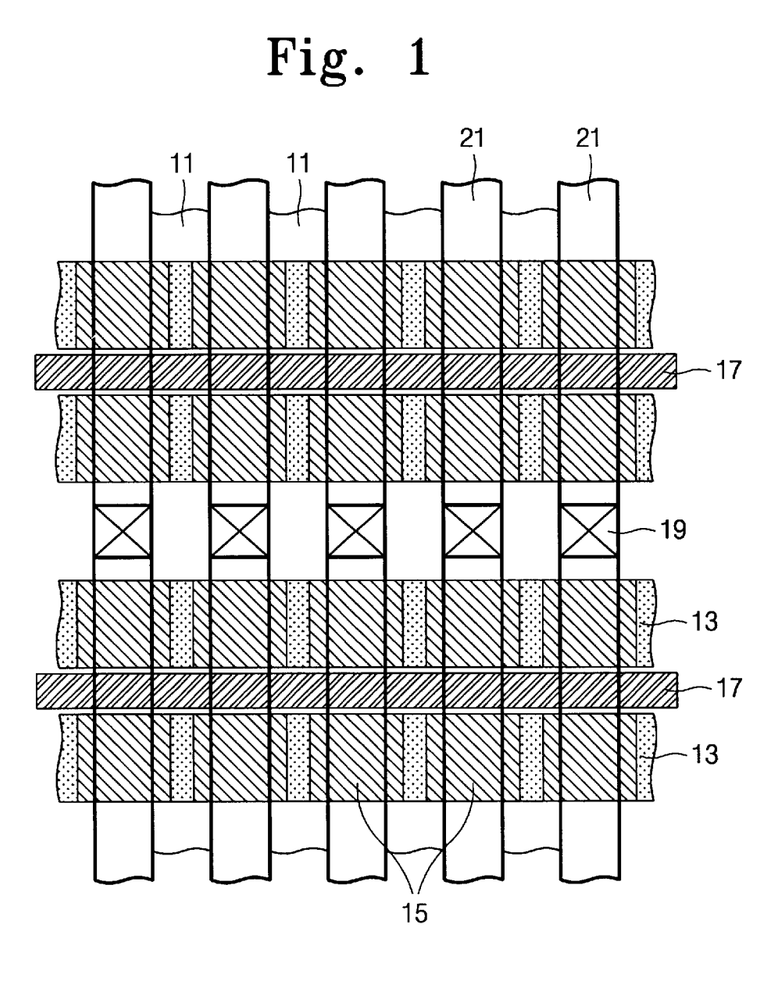
FIG. 1 is a layout showing a portion of cell region of a conventional NOR type flash memory device.

FIG. 1 is a top plan view showing a portion of a cell area of a general NOR type flash memory.

Referring now to FIG. 1, isolation areas 11 are formed on a substrate to form an active region. The active region comprises a plurality of longitudinal band shaped sub-regions which are defined respectively by a plurality of longitudinal openings or gaps of the isolation areas 11. Floating gates 15 are disposed between word lines 13 and the active region on the portions of the substrate surfaces where the word lines 13 overlay the active region. The floating gates 15 are separated from the word lines 13 and the active region by a dielectric layer and a gate insulating layer, respectively. Also, each floating gate 15 partially overlaps an isolation area 11 at both of its edges. Source lines 17, positioned parallel to the word lines 13, are formed by removing portions of the isolation area 11 positioned on the surface of the substrate using the word lines 13 as a mask, and then carrying out ion implantation on the exposed surface of the substrate. Contacts 19, with which bit lines 21 are connected, are formed in a drain region between the word lines 13 disposed between the source lines 17.

Figure 2:
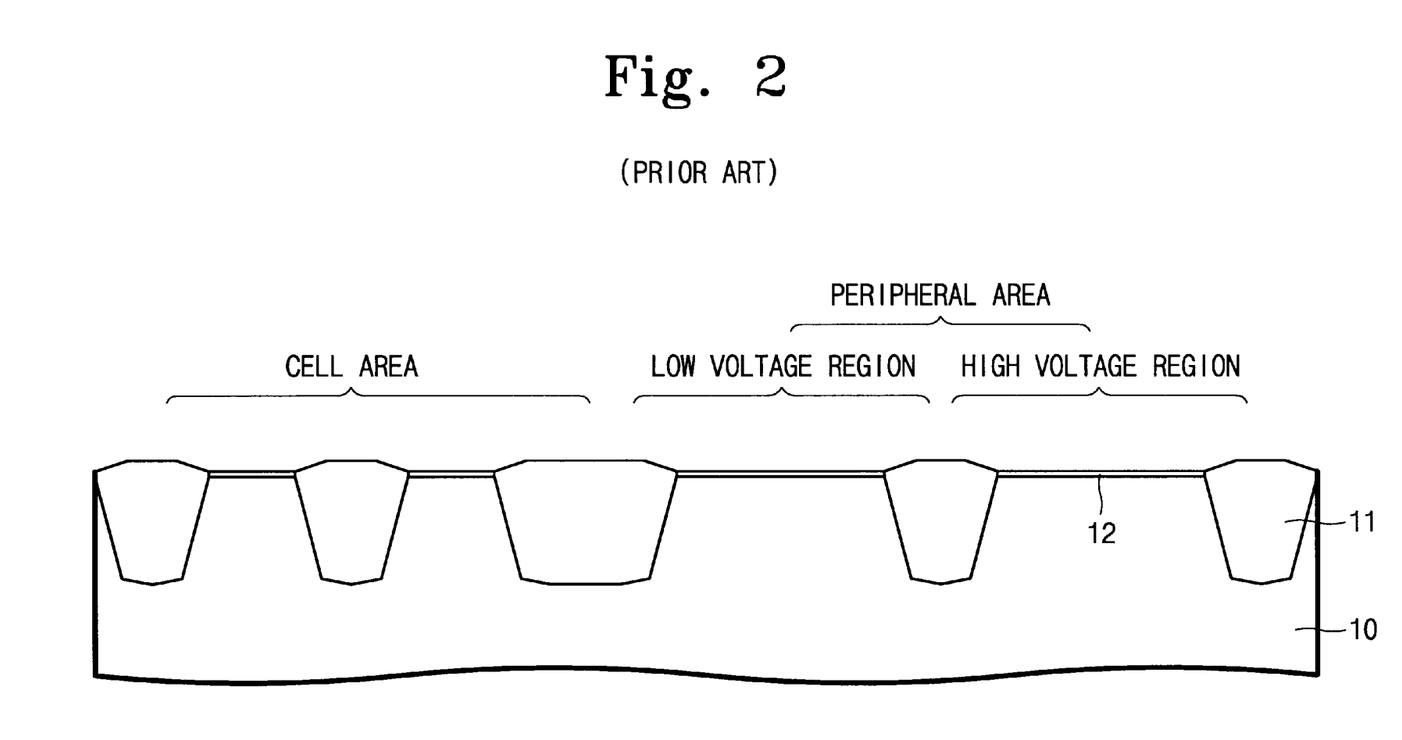
FIG. 2 to FIG. 4 are cross-sectional views of a semiconductor device showing the sequential formation of layers used in a conventional method of manufacturing a NOR type flash memory device.
Figure 3:
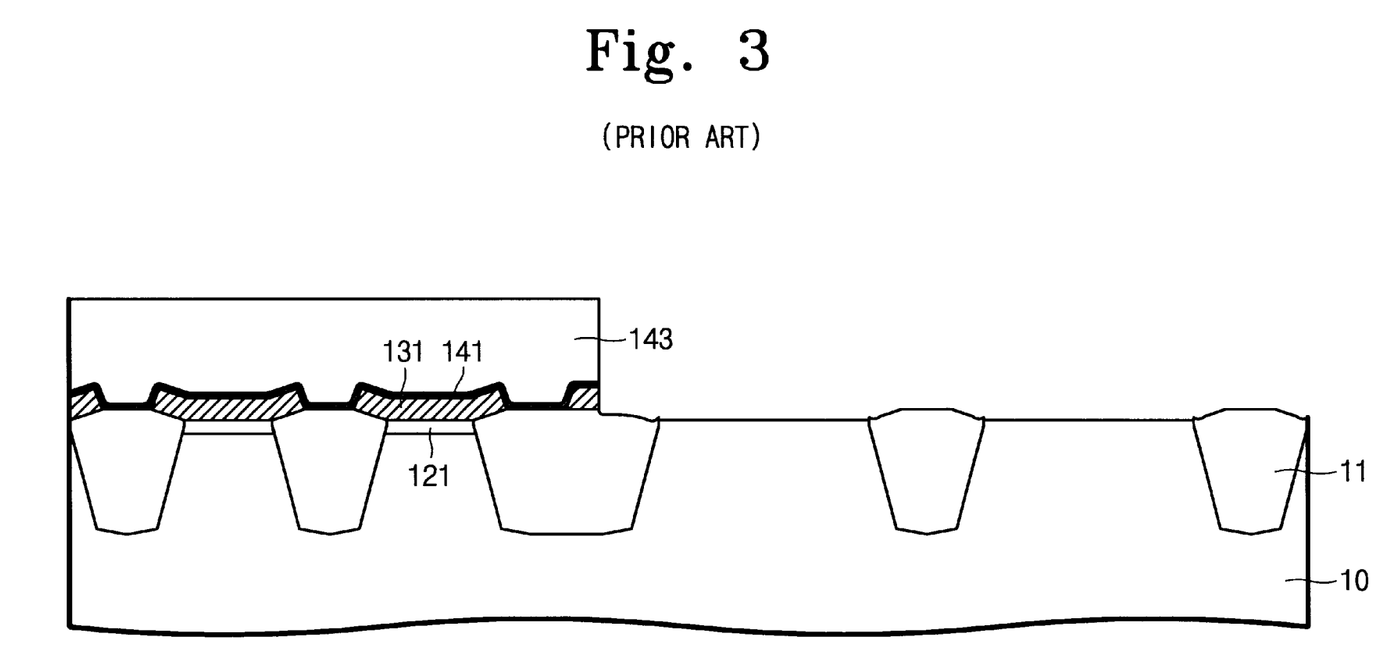
Figure 4:
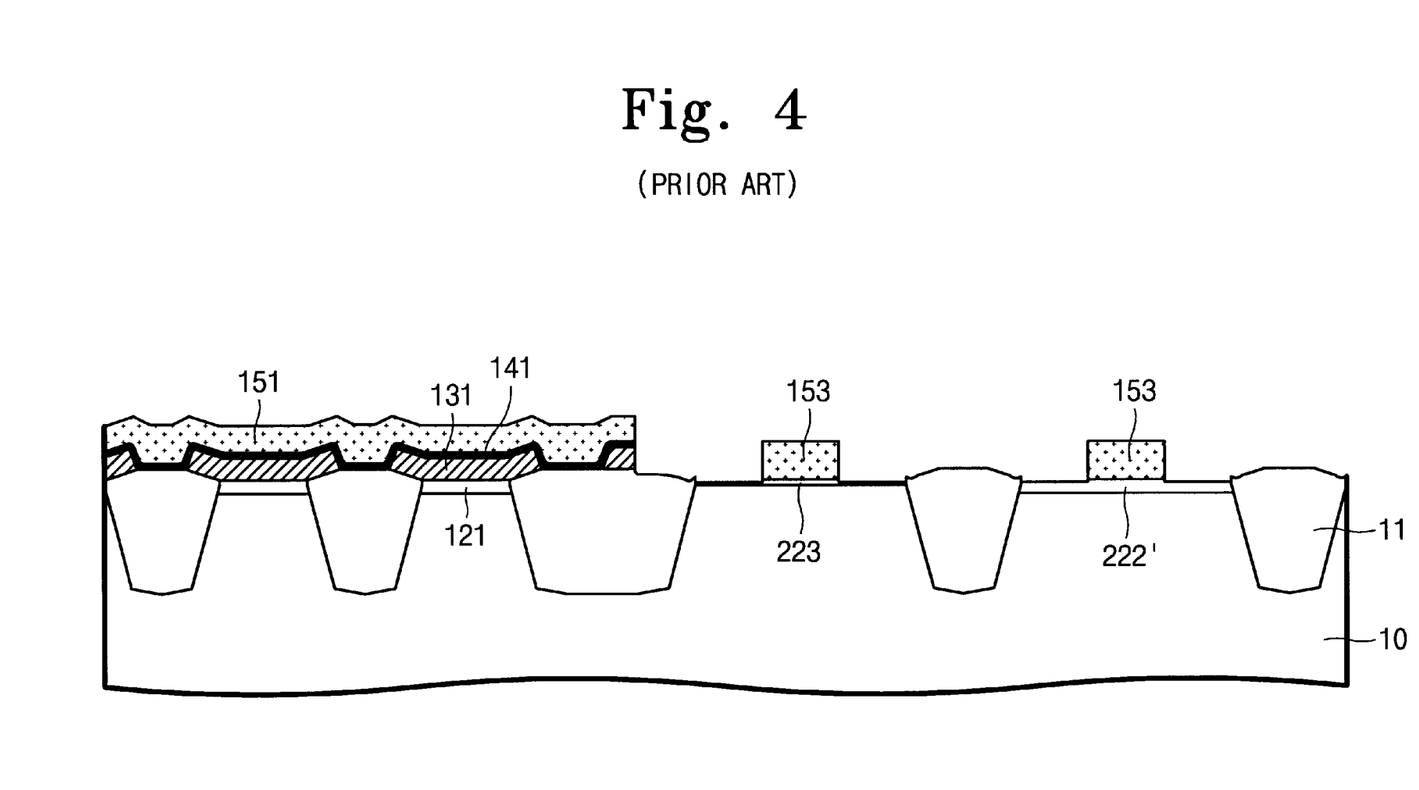

FIG. 2 to FIG. 4 are cross-sectional views of a semiconductor device showing the sequential formation of layers used in a conventional method of manufacturing a NOR type flash memory device. In the drawings, the processes of depositing and etching materials to form transistors in a cell area and transistors in high and low voltage regions of a peripheral circuit area are illustrated step by step. The cell area is shown as a section taken along the direction of the word lines, and the peripheral circuit area is shown as a section taken along the direction of connecting source/drain regions without dividing p-channel and n-channel.

Referring now to FIG. 2, isolation area 11 are formed on a substrate 10 to define an active region. Then, a buffer oxide layer 12 is formed on the active region of the substrate 10. In order to form all sorts of impurity wells, various ion implantation processes are performed. Each process is composed of forming an ion implantation mask according to the region to be implanted, carrying out ion implantation operations and removing the ion implantation mask.

Referring to FIG. 3, the buffer oxide layer 12 (from FIG. 2) in a cell region is removed and then a tunneling gate insulating layer 121 is formed. Thereafter, a floating gate layer is deposited on the tunneling gate insulating layer 121 and patterned to form a floating gate layer pattern 131. Then, an oxide-nitride-oxide (ONO) dielectric layer 141 is formed over the whole surface of the substrate to cover the floating gate layer pattern 131. Thereafter, an etch mask 143 is formed of a photoresist to cover the cell region, and the dielectric layer 141, the floating gate layer 131, and the buffer oxide layer 12 covering the active region in the peripheral circuit area are removed, so that surface of the active region in the peripheral circuit area is exposed. Then, the etch mask 143 is removed.

In succession, ion implantation processes for controlling threshold voltages of the high and low voltage transistors are carried out.

Referring to FIG. 4, a gate insulating layer 222' for the high voltage region is formed in the peripheral circuit area. Then, an etch mask, which exposes a low voltage region of the peripheral circuit area, is used to remove the portion of gate insulating layer 222' covering the low voltage region. After removing the high voltage gate insulating layer 222' formed in the low voltage region, the etch mask is removed and a gate insulating layer 223 is formed in the low voltage region. The gate insulating layers 222', 223 are formed of a silicon oxide layer which is made of thermally oxidized silicon. A silicon oxide layer is used rather than a silicon oxide nitride layer, otherwise a silicon oxide layer of the ONO dielectric layer 141 in the cell area exposed after the etch mask 143 is removed can be nitrified, negatively influencing the permittivity.

Next, a control gate layer 151 is deposited over the whole surface of the substrate and patterned to form word lines. While forming word lines in the cell region, the dielectric layer 141 and the floating gate layer 131 in the rest of the cell regions not overlaid by word lines are also removed by etching. Source lines positioned parallel to the word lines are formed by removing portions of the isolation area 11 positioned between the word lines using an etch mask pattern and the word lines as a mask, and then carrying out ion implantation in the exposed surface of the substrate. At this time, ion implantation is also carried out against a drain region. Thereafter, gate electrodes 153 for high and low voltage transistors are formed by patterning the control gate layer 151.

In the conventional method of manufacturing flash memory devices explained above, the dielectric layer 141 is generally formed of an ONO layer. Also, in several process steps, photoresist patterns are formed as etch or ion implantation masks on the dielectric layer 141 and/or the surface of the substrate 10. In particular, after the dielectric layer is formed over the whole surface of the substrate, a patterning process which forms a photoresist pattern on the dielectric layer is carried out. Also, in order to carry out ion implantation processes for controlling threshold voltages of the high and low voltage transistors, photoresist patterns are formed on the dielectric layer in the cell and the exposed surface of the substrate in the peripheral circuit area after the etch mask for removing the dielectric layer and the floating gate layer in the peripheral circuit area is removed. Also, after the gate insulating layer 222' for the high voltage region is formed in the peripheral circuit area, a photoresist pattern exposing the low voltage region in the peripheral circuit area is formed on the dielectric layer in the cell area and the gate insulating layer 222' in the high voltage area to remove the gate insulating layer 222' for high voltage from the low voltage region. Thus, in respective subsequent processes, the used photoresist patterns have to be removed.

Since the photoresist patterns are crystallized to the polymer shape during the ion implantation or etch process, in order to completely remove the photoresist patterns, a mixture of $NH_4OH$, $H_2O_2$, and de-ionized water or a hydrofluoric acid should be used as the etchant. However, in this case, the ONO dielectric layer can be damaged by the etchant, negatively impacting the function of the flash memory device. Accordingly, the photoresist patterns are removed only by $O_2$ plasma ashing and sulfuric acid ($H_2SO_4$) strip processes in the respective subsequent processes, so that it is impossible to completely remove the photoresist patterns. Remains of the photoresist patterns may act to accelerate degradation or aging of the dielectric layer or the gate insulating layer.

Also, even if the photoresist patterns are completely removed, a very small amount of heavy metal contained in the photoresist can still remain on the surface of the substrate or the ONO dielectric layer. The metal may diffuse in subsequent processes such as annealing or thermal oxidation, or cause crystal damage to occur on the substrate in the etching or ion implantation process, thereby deteriorating characteristics of the dielectric layer or the gate insulating layer and in turn functions of the resultant flash memory device.

SUMMARY OF THE INVENTION

The present invention relates to method of manufacturing a flash memory device, and more particularly to method of manufacturing a flash memory device that improves the quality of the gate insulating layer and the dielectric layer of the device. These improvements greatly improve the operating characteristics of the device.

It is an object of the present invention to provide an improved method of manufacturing a flash memory device which can improve the characteristics of the dielectric layer and the gate insulating layer.

It is another object of the present invention to provide an improved method of manufacturing a flash memory device which can minimize damage to the silicon substrate due to the ion implantation or etching process in order to reduce the shift and variation of the threshold voltage, and further to prevent functional defects due to the photoresist cleaning process from occurring.

These and other objects are provided, according to the present invention, by preventing photoresist patterns from being formed and removed directly on a surface of the substrate or the dielectric layer, and by separately forming a control gate layer of transistors in a cell area and a gate layer of transistors in a peripheral circuit area of the substrate. A preferred embodiment of the present invention includes the steps of forming a gate insulating layer in high and low voltage regions of a peripheral circuit area and then forming a gate layer on the gate insulating layer, followed by forming a transistor structure in a cell area of the substrate composed of a tunneling gate insulating layer, a floating gate layer, a dielectric layer and a control gate layer. Specifically, the step of forming the transistor structure in the cell area is carried out after the step of forming the gate insulating layer and the gate layer in the peripheral circuit area.

The thickness of the gate insulating layer can be varied according to regions on which it is disposed, i.e., high and low voltage regions of the peripheral circuit area. This step can be carried out by forming a gate insulating layer for high voltage in at least all the active regions of the peripheral circuit area, removing the gate insulating layer for high voltage from the low voltage region of the peripheral circuit area by using an etch mask, forming a gate insulating layer for low voltage on the low voltage region after removing the etch mask, and forming the gate layer over the substrate where the gate insulating layer for low voltage is formed.

The step of forming the transistor structure in the cell area can be carried out by the sub-steps comprising: forming the tunneling gate insulating layer in all the active regions of the cell area, forming a floating gate layer pattern over the tunneling gate insulating layer, forming the dielectric layer over the floating gate layer pattern, forming a control gate layer over the dielectric layer, and carrying out self-aligned etching against the dielectric layer and then the floating gate layer pattern by using word lines as an etch mask after forming the word lines by patterning the control gate layer.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIG. 5 to FIG. 11 are cross-sectional views of a semiconductor device showing the sequential formation of layers used in a method of manufacturing a flash memory device in accordance with one embodiment of the present invention.

Figure 5:
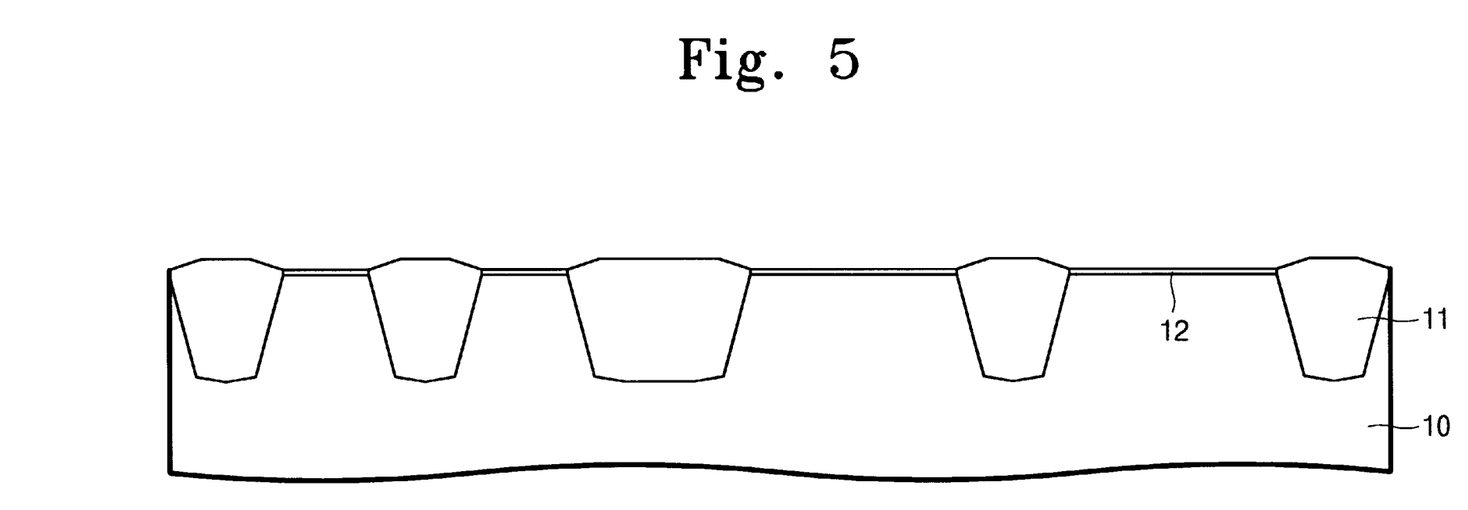
FIG. 5 to FIG. 11 are cross-sectional views of a semiconductor device showing the sequential formation of layers used in a method of manufacturing a flash memory device in accordance with one embodiment of the present invention.

Referring now to FIG. 5, isolation areas 11 are formed on a substrate 10. Isolation areas 11 are formed using a shallow trench isolation process. Preferably, each of side walls of an isolation area 11 has a gentle slope that is easy to be filled. Next, a buffer oxide layer 12 is formed on the active regions of the substrate to a thickness between 100 Å and 300 Å. In order to form all sorts of impurity wells (not shown in the drawings), various ion implantation processes are performed. Particularly, ion implantation processes for forming impurity wells in low and high voltage regions of a peripheral circuit area are performed. The buffer oxide layer 12 is then removed by a chemical-mechanical polishing (CMP) process.

Figure 6:
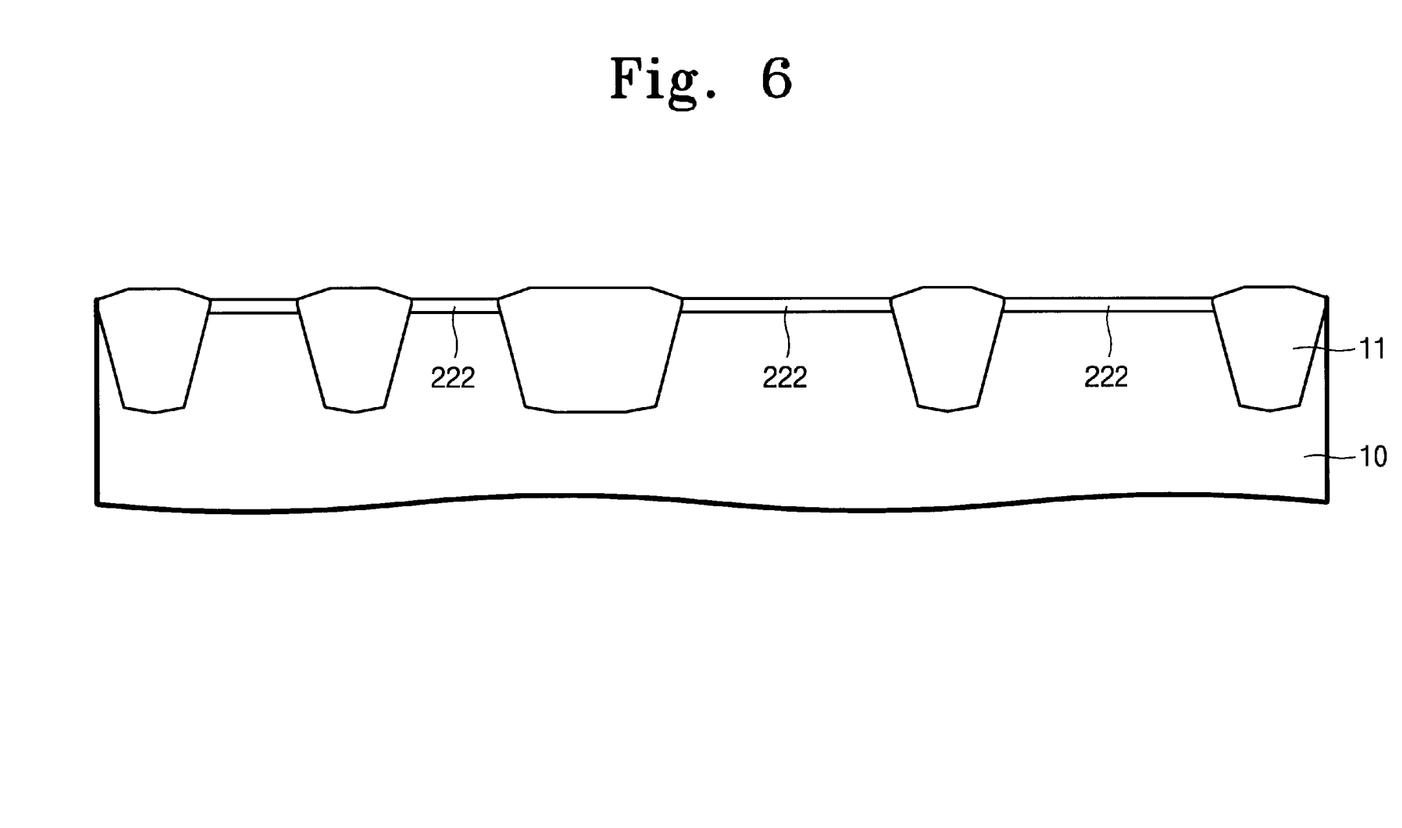

Referring to FIG. 6, after the buffer oxide layer 12 in the peripheral circuit area is removed, a high voltage gate insulating layer 222 is formed on the substrate 10. Alternatively, the high voltage gate insulating layer 222 can be formed over the entire surface of the substrate 10 and the isolation areas 11. At this time, the high voltage gate insulating layer 222 is formed to the same thickness as a low voltage gate insulating layer having relatively small thickness compared with a high voltage gate insulating layer in the resultant flash memory device. Also, the high voltage gate insulating layer 222 can be formed of a silicon oxide nitride layer (SiON), since there is no ONO dielectric layer as taught by the prior art.

Figure 7:
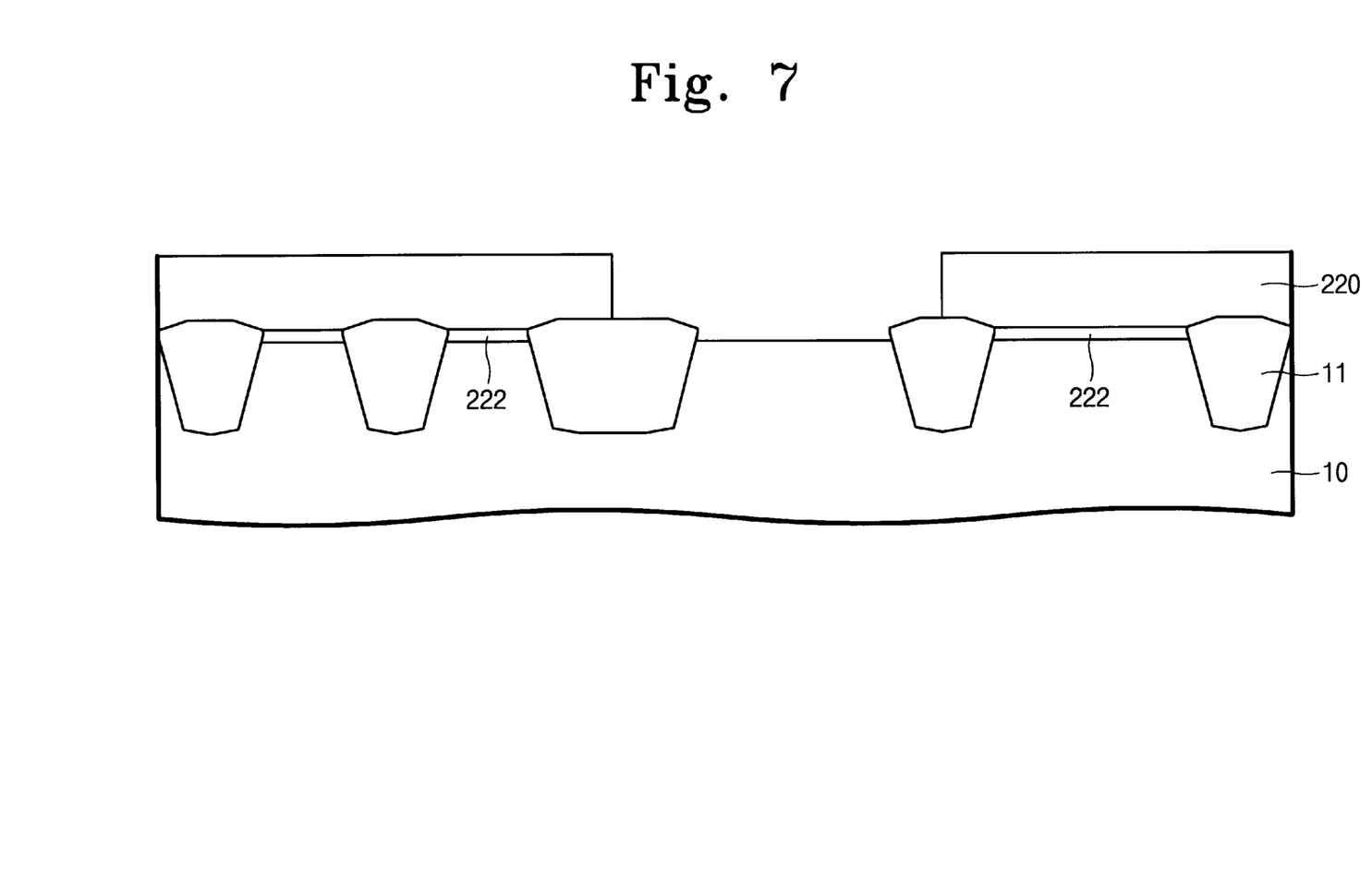
Figure 8:
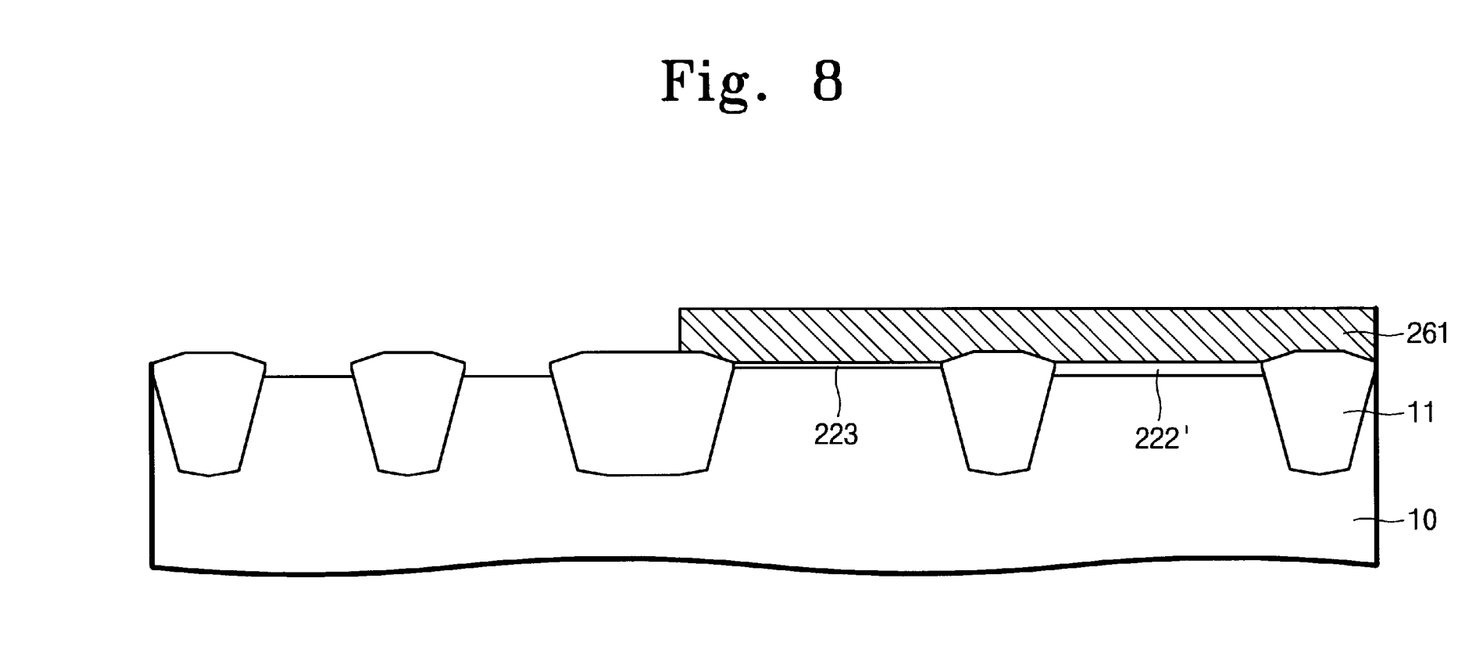

Referring to FIG. 7 and FIG. 8, a photoresist pattern 220 exposing the low voltage region of the peripheral circuit area is formed over the substrate 10. Then, the high voltage gate insulating layer 222 is etched using the photoresist pattern 220 as an etch mask. Next, the photoresist pattern 220 is removed and a thin low voltage gate insulating layer 223 is formed by thermal oxidation process. At this time, in the high voltage region, a high voltage gate insulating layer 222' having relatively large thickness compared with the low voltage gate insulating layer 223 is formed. Thereafter, a first conduction layer 261 is deposited and then patterned to have portions thereof remaining only in the peripheral circuit area. Preferably, the first conduction layer 261 is formed of a polysilicon layer having a thickness between 1,000 Å and 5,000 Å. Next, an ion implantation process for controlling the threshold voltage of transistors and an annealing process following the ion implantation are performed in the cell area. Then, the high voltage gate insulating layer 222' in the cell area is removed to expose the active region of the substrate. Alternatively, in cases where there is no difference between the thickness of the gate insulating layer in the low voltage region of the peripheral circuit area and that of the tunneling gate insulating layer in the cell area, the tunneling gate insulating layer can be formed concurrently with the gate insulating layer, and is not removed after the ion implantation process is performed in the cell area.

Figure 9:
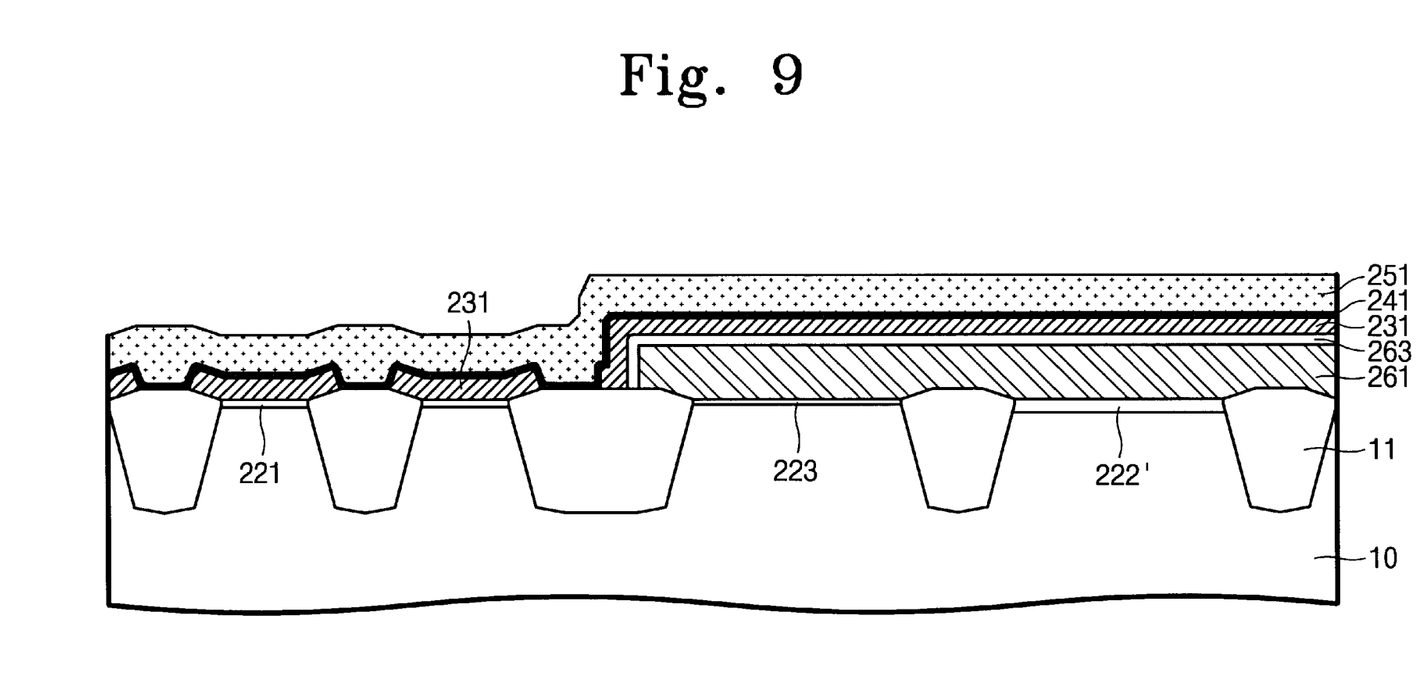

Referring to FIG. 9, a thermal oxidation process is performed on the substrate 10. A thermal oxide layer 263 is formed on the surface of the first conduction layer 261. In the active region of the cell area of the substrate, a tunneling gate insulating layer 221 is formed of a silicon oxide layer. At this time, on the surface of the first conduction layer 261, a silicon oxide nitride layer can be formed by adding nitrogen. Then, a floating gate conduction layer, which is usually formed of a doped polysilicon layer, is deposited and patterned to form a floating gate conduction layer pattern 231. At the same time, in the peripheral circuit area, the floating conduction layer remains just as it is, whereas in the cell area, the floating gate conduction layer pattern 231 is formed to overlap some portions of the isolation area 11 while covering the active region.

Next, a dielectric layer 241 is formed over the entire surface of substrate 10.

Preferably, the dielectric layer 241 is formed of an ONO layer in which a silicon oxide layer of 30 Å to 50 Å, a silicon nitride layer of 60 Å to 80 Å, and a silicon oxide layer of 40 Å to 70 Å are deposited in the same relative order. After forming the dielectric layer, a control gate conduction layer 251 is formed over the entire surface of substrate 10. The control gate conduction layer 251 is generally formed of a polysilicon layer. Alternatively, the control gate conduction layer 251 can be formed of a metal silicide layer in order to improve conductivity. Preferably, the thickness of the control gate conduction layer 251 is 1,000 Å to 3,000 Å.

Figure 10:
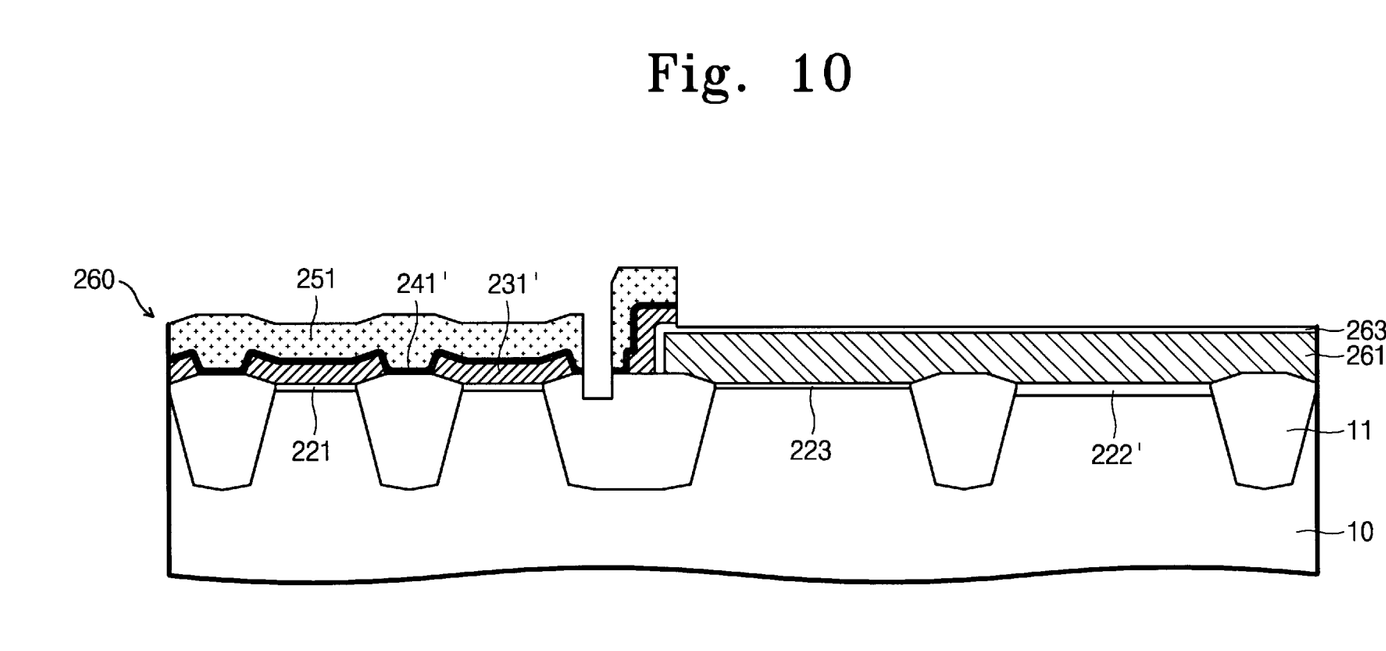

Referring to FIG. 10, the substrate over which the control gate conduction layer 251 is formed is patterned to form word lines. In particular, a first photoresist pattern (not shown) is formed as an etch mask. Then, in the cell region, the control gate conduction layer 251, the dielectric layer 241, and the floating gate conduction layer pattern 231 are continuously etched to form word lines 260, a dielectric pattern 241', and floating gates 231 ' by using the photoresist pattern as an etch mask. Also, the control gate conduction layer 251, the dielectric layer 241, and the floating gate conduction layer 231 that were deposited in the peripheral circuit area are removed. At this time, the thermal oxide layer 263 that covers the first conduction layer 261 functions as an etch stop layer. Next, the photoresist pattern is removed.

In order to form source lines, portions of the isolation areas 11 positioned between word lines 260 are removed to expose surfaces of the substrate 10. Ion implantation is then performed on the exposed surfaces of the substrate 10. At this time, a portion of exposed thermal oxide layer 263 is removed. In particular, a photoresist pattern is first formed as an etch mask for removing portions of the isolation areas 11 between word lines. Then, in order to remove portions of the isolation areas 11 to to expose surfaces of substrate 10, the word lines along with the photoresist pattern is used as a self-aligning etch mask. Thereafter, a highly doped n+ ion implantation is carried out against the exposed surfaces of substrate 10 to form source lines. The highly doped n+ ion implantation is also performed against a drain region of the cell area. Thus, a cell transistor structure is obtained. At this time, in other to improve conductivity, ion implantation is also performed against the polysilicon layer 251 to form control gates and against the polysilicon layer 261 to form the gate layer of the peripheral circuit area.

Figure 11:
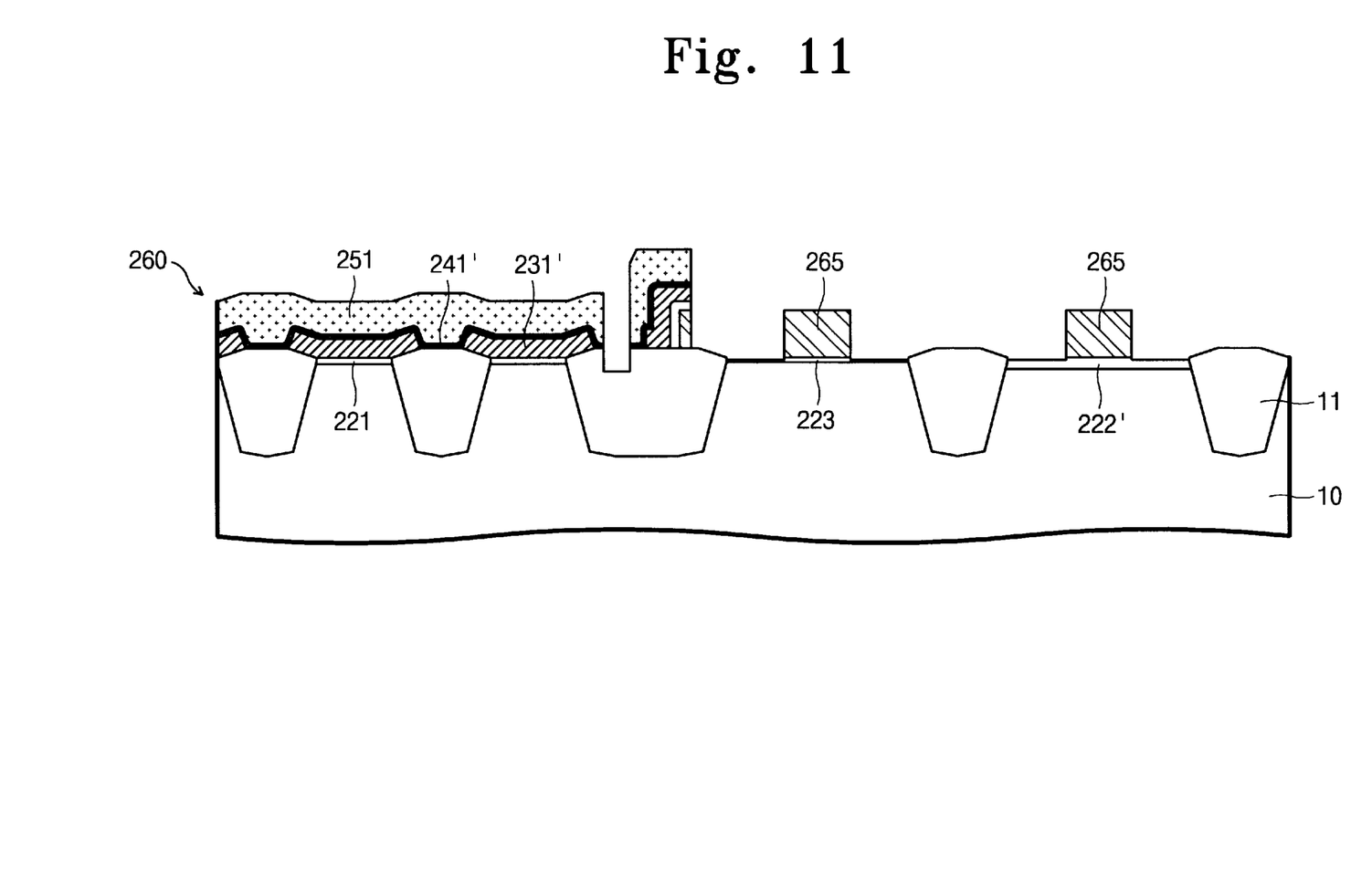

Referring to FIG. 11, the first conduction layer 261 in the low and the high voltage regions of the peripheral circuit area is patterned to form gate electrodes 265. Then, ion implantation is performed to form source/drain regions in the peripheral circuit area. Processes occurring after this time are carried out according to general methods of forming complementary metal oxide silicate (CMOS) devices that are well-known in the art.

Figure 12:
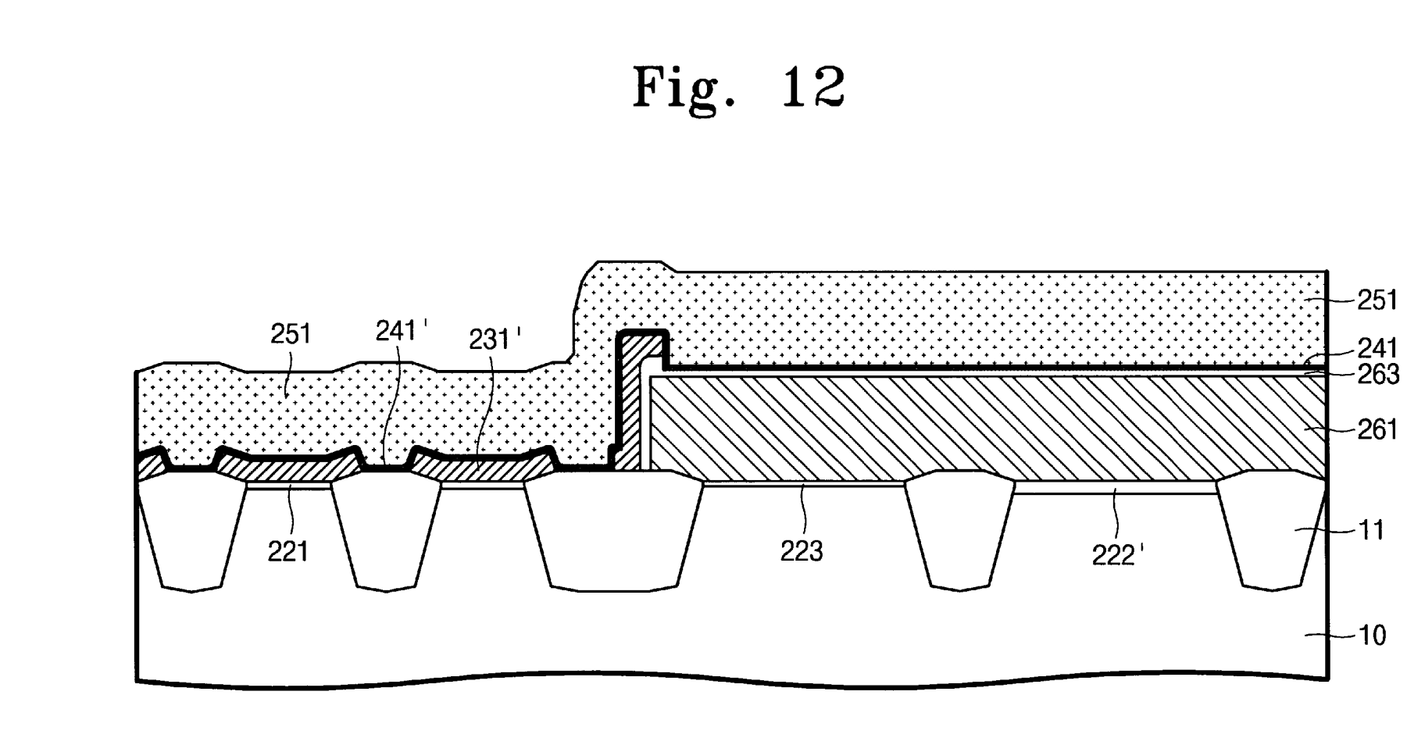
FIG. 12 to FIG. 13 are cross-sectional views of a semiconductor device showing the sequential formation of layers used in a method of manufacturing a flash memory device in accordance with another embodiment of the present invention.
Figure 13:
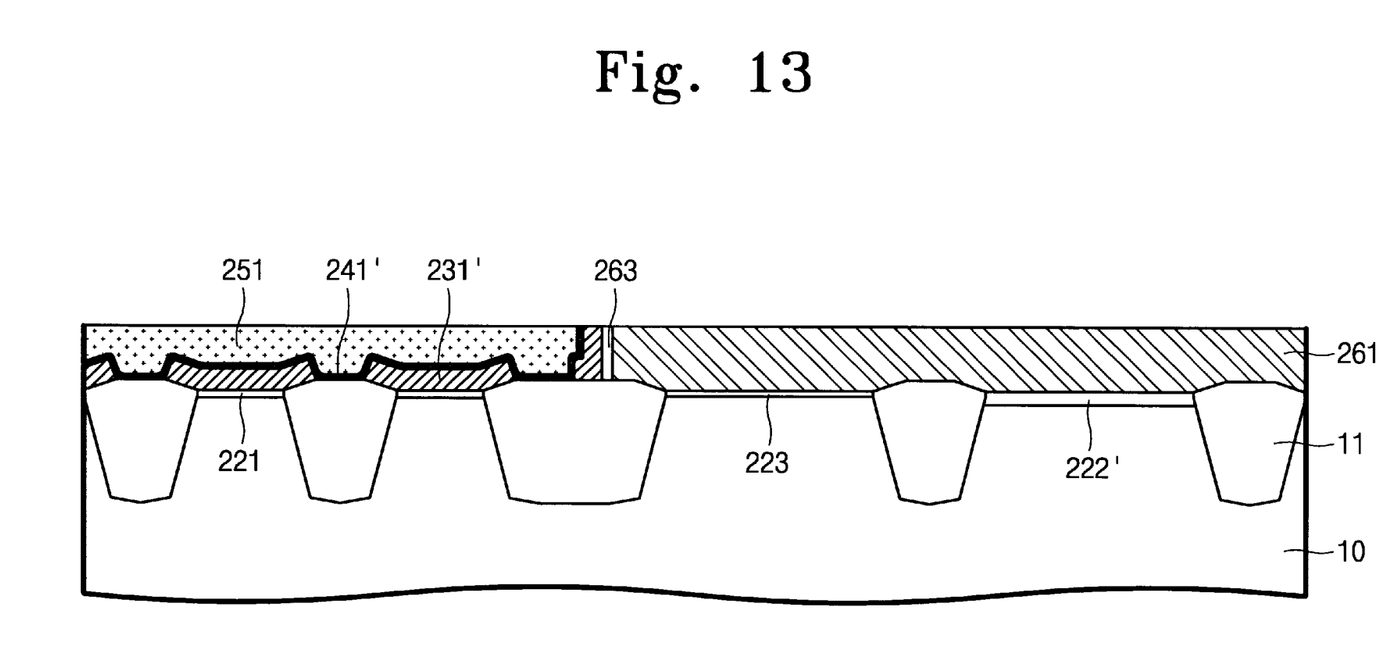

FIG. 12 to FIG. 13 are cross-sectional views of a semiconductor device showing the sequential formation of layers used in a method of manufacturing flash memory devices in accordance with another embodiment of the present invention.

Referring to FIG. 12, at the step of forming a first conduction layer 261 as shown in FIG. 8, the first conduction layer 261 is formed to a thickness greater than that of floating gate conduction layer 231, for example, 3,000 Å to 5,000 Å. Therefore, the height of the upper surface of the first conduction layer 261 is higher than or the same as that of the upper surface of the control gate conduction layer 251 which is deposited over the cell area of the substrate in a later process.

Referring to FIG. 13, the whole surface of the substrate as shown in FIG. 12 is planarized by a CMP process and then subsequent processes are performed. In this case, the uniformity and surface step of the substrate is improved, thereby improving process margin and quality in the subsequent processes.

It is apparent from the foregoing description that the present invention provides a method of manufacturing a flash memory device that prevents photoresist patterns from being formed on and removed directly from a surface of the substrate or a dielectric layer, thereby improving the characteristics of the dielectric layer and the gate insulating layer. The endurance and retention characteristics of a flash memory device has a close correlation with these layers.

Additionally, the present invention provides a method of manufacturing a flash memory device that prevents continuous degradation or aging of the device, or shifts and variations of the threshold voltages of the device due to very small amounts of remaining heavy metal and photoresist. This increases safety and reliability, and further reduces the number of defective elements, thereby increasing the mass productivity.

In the drawings and specification, there have been disclosed typical preferred embodiments of the invention and, although specific terms are employed, they are used in a generic and descriptive sense only and not for purpose of limitation, the scope of the invention being set forth in the following claims. In the following claims, the prepositions "over" and "on" are used frequently. "Over" indicates relative positional location between two objects that are not necessarily in contact with each other. "On" however, indicates relative positional location and also that the two objects are in contact with each other as well.

What is claimed is:

1. A method of manufacturing a flash memory device on a substrate having a cell area and a peripheral circuit area comprising the steps of:
    forming a gate insulating layer and a gate conduction layer on the substrate in the peripheral circuit area;
    forming a tunneling gate insulating layer, a floating gate conduction layer pattern, and a dielectric layer over the substrate in the cell area;
    forming a control gate conduction layer over the substrate in the cell area and over the substrate in the peripheral circuit area;
    forming a photoresist pattern on the control gate conduction layer;
    forming word lines, a dielectric layer pattern, and floating gates over the substrate in the cell area by sequentially etching the control gate conduction layer, the dielectric layer, and the floating gate conduction layer pattern using the photoresist pattern as an etch mask; and
    forming gate electrodes by patterning the gate conduction layer over the substrate in the peripheral circuit area.

2. The method of claim 1, wherein said step of forming a gate insulating layer on the substrate in the peripheral circuit area comprises:
    forming a high voltage gate insulating layer on the substrate;
    removing the high voltage gate insulating layer from the low voltage region of the peripheral circuit area; and
    forming a low voltage gate insulating layer on the substrate in the low voltage region.

3. The method of claim 2, wherein the low voltage gate insulating layer of the peripheral circuit area is formed concurrently with the tunneling gate insulating layer of the cell area.

4. The method of claim 1, wherein said step of forming a tunneling gate insulating layer, a floating gate conduction layer pattern, and a dielectric layer on the substrate in the cell area comprises:
    forming the tunneling gate insulating layer on the substrate in the cell area while concurrently forming a thermal oxide layer on the gate conduction layer in the peripheral circuit area;
    forming a floating gate conduction layer on the tunneling gate insulating layer in the cell area and the thermal oxide layer in the peripheral circuit layer;
    forming the floating gate conduction layer pattern in the cell area by patterning the floating gate conduction layer; and
    forming said dielectric layer over an entire surface of the substrate.

5. The method of claim 4, wherein the floating gate conduction layer pattern completely covers the active area of the cell region of the substrate, and partially overlays a plurality of isolation areas in the cell region of the substrate.

6. The method of claim 4, wherein the thermal oxide layer is used as an etch stop layer during the step of forming said lines, a dielectric layer pattern, and floating gates over the substrate in the cell area.

7. The method of claim 1, wherein the gate conduction layer has a thickness greater than that of the floating gate conduction layer.

8. The method of claim 1, further including the step of planarizing the whole surface of the substrate by using a chemical-mechanical polishing process after the step of forming a control gate conduction layer.

9. A method of manufacturing a flash memory device on a substrate having a cell area and a peripheral circuit area comprising the steps of:
    forming a high voltage gate insulating layer on the substrate in the peripheral circuit area;
    removing the high voltage gate insulating layer from a low voltage region of the peripheral circuit area;
    forming a low voltage gate insulating layer on the substrate in the low voltage region;
    forming a gate conduction layer on the substrate in the peripheral circuit area;
    forming a tunneling gate insulating layer on the substrate in the cell area, and a thermal oxide layer on the gate conduction layer in the peripheral circuit area;
    forming a floating gate conduction layer on the tunneling gate insulating layer and the thermal oxide layer;
    forming a floating gate conduction layer pattern over the substrate in the cell area by patterning the floating gate conduction layer;
    forming a dielectric layer over an entire surface of the substrate;

forming a control gate conduction layer over an entire surface of the substrate;

forming word lines, a dielectric layer pattern, and floating gates in the cell area by sequentially etching the control gate conduction layer, the dielectric layer, and the floating gate conduction layer pattern; and forming gate electrodes by patterning the gate conduction layer over the substrate in the peripheral circuit area.

10. The method of claim 9, wherein prior to the step of forming a high voltage gate insulating layer on the substrate in the peripheral circuit area a further step is performed comprising:

forming a buffer oxide layer on the substrate to a thickness between 100 Å and 300 Å;

performing various ion implantation processes for forming impurity wells in the high and low voltage regions of the peripheral circuit area; and removing the buffer dioxide layer that was deposited on the substrate by a chemical-mechanical polishing process.

11. The method of claim 9, wherein the gate conduction layer is made of polysilicon and has a thickness between 1,000 Å and 5,000 Å.

12. The method of claim 9, wherein the dielectric layer is composed of a silicon oxide layer of 30 Å to 50 Å thick on a silicon nitride layer of 60 Å to 80 Å thick on a silicon oxide layer of 40 Å to 70 Å thick.

13. The method of claim 9, wherein the control gate conduction layer is formed of a metal silicide and has a thickness between 1,000 Å and 3,000 Å.

14. The method of claim 9, wherein the gate conduction layer has a thickness greater than that of the floating gate conduction layer.

15. The method of claim 9, further including the step of planarizing the whole surface of the substrate by using a chemical-mechanical polishing process after the step of forming a control gate conduction layer.

16. A method of manufacturing a flash memory device having a cell area and a peripheral circuit area on a substrate comprising the steps of:

forming a gate insulating layer and a gate conduction layer on said substrate in said peripheral circuit area;

forming a tunneling gate insulating layer, a floating gate conduction layer pattern and a dielectric layer on said substrate in said cell area;

forming a control gate conduction layer over said substrate in said cell area and in said peripheral circuit area;

forming word lines, dielectric layer pattern, and floating gates over said substrate in said cell area by etching partially said control gate conduction layer, said dielectric layer, and said floating gate conduction layer pattern in order; and forming gate electrodes by patterning said gate conduction layer over said substrate in said peripheral circuit area.

17. The method of manufacturing a flash memory device according to claim 16, wherein said step of forming said gate insulating layer comprising:

forming a gate insulating layer for high voltage on said substrate in said peripheral circuit area;

removing said gate insulating layer for high voltage from a low voltage region of said peripheral circuit area; and forming a gate insulating layer for low voltage on said substrate in said low voltage region.

18. The method of manufacturing a flash memory device according to claim 16, wherein said tunneling gate insulating layer is formed along with said gate insulating layer for low voltage of said peripheral circuit area.

19. The method of manufacturing a flash memory device according to claim 16, wherein said step of forming said tunneling gate insulating layer, said floating gate conduction layer pattern and said dielectric layer in said cell area includes:

forming said tunneling gate insulating layer on said substrate in said cell area, and a thermal oxide layer on said gate conduction layer of said peripheral circuit area;

forming a floating gate conduction layer on said tunneling gate insulating layer and said thermal oxide layer;

forming said floating gate conduction layer pattern in said cell area by patterning said floating gate conduction layer; and forming said dielectric layer on said floating gate conduction layer pattern in said cell area and said floating gate conduction layer in said peripheral circuit area.

20. The method of manufacturing a flash memory device according to claim 19, wherein said thermal oxide layer is used as an etch stop layer during said step of forming said word lines, said dielectric layer pattern, and said floating gates over said substrate in said cell area.

21. The method of manufacturing a flash memory device according to claim 16, wherein said gate conduction layer is formed to have a thickness larger than that of said floating gate conduction layer.

22. The method of manufacturing a flash memory device according to claim 16, further including the step of planarizing the whole surface of said substrate by using a CMP process after said step of forming a control gate conduction layer.

* * * * *